United States Patent
Iwashita et al.

(10) Patent No.: US 8,054,015 B2
(45) Date of Patent: Nov. 8, 2011

(54) MOTOR DRIVE APPARATUS EQUIPPED WITH DYNAMIC BRAKING CIRCUIT FAULT DETECTION CAPABILITY

(75) Inventors: Yasusuke Iwashita, Yamanashi (JP); Tadashi Okita, Yamanashi (JP); Hiroyuki Kawamura, Yamanashi (JP); Kenichi Takayama, Yamanashi (JP)

(73) Assignee: Fanuc Ltd, Minamitsuru-gun (JP)

( * ) Notice: Subject to any disclaimer, the term of this patent is extended or adjusted under 35 U.S.C. 154(b) by 469 days.

(21) Appl. No.: 12/324,972

(22) Filed: Nov. 28, 2008

(65) Prior Publication Data

US 2009/0174349 A1   Jul. 9, 2009

(30) Foreign Application Priority Data

Jan. 9, 2008   (JP) .................................. 2008-001916

(51) Int. Cl.
*H02P 3/18* (2006.01)
(52) U.S. Cl. .................. 318/376; 318/372; 318/375
(58) Field of Classification Search .................. 318/372, 318/375, 376
See application file for complete search history.

(56) References Cited

U.S. PATENT DOCUMENTS

| | | | | |
|---|---|---|---|---|
| 5,070,290 A | * | 12/1991 | Iwasa et al. .................. | 318/758 |
| 7,084,601 B2 | * | 8/2006 | Maeda et al. ................. | 318/806 |
| 2004/0160208 A1 | * | 8/2004 | Youm et al. ................... | 318/801 |
| 2004/0232864 A1 | * | 11/2004 | Sunaga et al. ................ | 318/434 |
| 2007/0291426 A1 | * | 12/2007 | Kasunich et al. ............. | 361/33 |

FOREIGN PATENT DOCUMENTS

| | | | |
|---|---|---|---|
| JP | 7322663 A | | 12/1995 |
| JP | 8033195 A | | 2/1996 |
| JP | 2000253687 A | | 9/2000 |
| JP | 2003009560 A | | 1/2003 |

OTHER PUBLICATIONS

Machine translation of JP08033195A.*
Notice of Reasons for Rejection for JP2008-001916 mailed Feb. 17, 2009.

* cited by examiner

*Primary Examiner* — Walter Benson
*Assistant Examiner* — Kawing Chan
(74) *Attorney, Agent, or Firm* — Lowe, Hauptman, Ham & Berner, LLP (57) ABSTRACT

A motor drive includes a dynamic braking circuit for producing a deceleration torque utilizing a braking force caused by a synchronous motor acting as a generator when the synchronous motor is deenergized. The motor drive apparatus is equipped with a dynamic braking circuit fault detection capability, a DC power supply which is obtained by rectifying input AC power, voltage application function for applying a voltage to the windings of the synchronous motor and to the dynamic braking circuit for a predetermined length of time by switching power transistors connected to the DC power supply, current detection unit for detecting the value of a current flowing from the power transistors, and fault checking unit for checking the dynamic braking circuit for the presence or absence of a fault, based on the current value detected by the current detection unit and on a predefined threshold value.

4 Claims, 7 Drawing Sheets

(A) POWER TRANSISTOR ON/OFF SIGNAL GENERATED FROM DYNAMIC BRAKING CIRCUIT CONTROL SIGNAL (B) WAVEFORM OF CURRENT WHEN DYNAMIC BRAKING CIRCUIT IS NOT CONNECTED (S1 AND S2 OPEN)

$Vdc/L \times \Delta t$  $(L = L_u + (1/L_v + 1/L_w)^{-1})$ (C) WAVEFORM OF CURRENT WHEN DYNAMIC BRAKING CIRCUIT IS CONNECTED (S1 AND S2 CLOSED)

$Vdc/L \times \Delta t$  $(L = L_u + (1/L_v + 1/L_w)^{-1})$ $Vdc/R$  $(R = R_u + (1/R_v + 1/R_w)^{-1})$

TIME

FIG. 4

(A) POWER TRANSISTOR ON/OFF SIGNAL GENERATED FROM DYNAMIC BRAKING CIRCUIT CONTROL SIGNAL (B) WAVEFORM OF CURRENT WHEN DYNAMIC BRAKING CIRCUIT IS NOT CONNECTED (S1 AND S2 OPEN)

(C) WAVEFORM OF CURRENT WHEN DYNAMIC BRAKING CIRCUIT IS CONNECTED (S1 AND S2 CLOSED)

TIME

MOTOR DRIVE APPARATUS EQUIPPED WITH DYNAMIC BRAKING CIRCUIT FAULT DETECTION CAPABILITY

RELATED APPLICATIONS

The present application is based on, and claims priority from, Japanese Application Number 2008-001916, filed Jan. 9, 2008, the disclosure of which is hereby incorporated by reference herein in its entirety.

BACKGROUND OF THE INVENTION

1. Field of the Invention

The present invention relates to a motor drive apparatus equipped with a dynamic braking circuit fault detection capability, and more particularly to a motor drive apparatus having a capability to detect faults in a dynamic braking circuit (such as a contact welding defect or an electrically inoperable contact, breakage of a resistor, disconnection of a connecting cable, etc.).

2. Description of the Related Art

Figure 7:
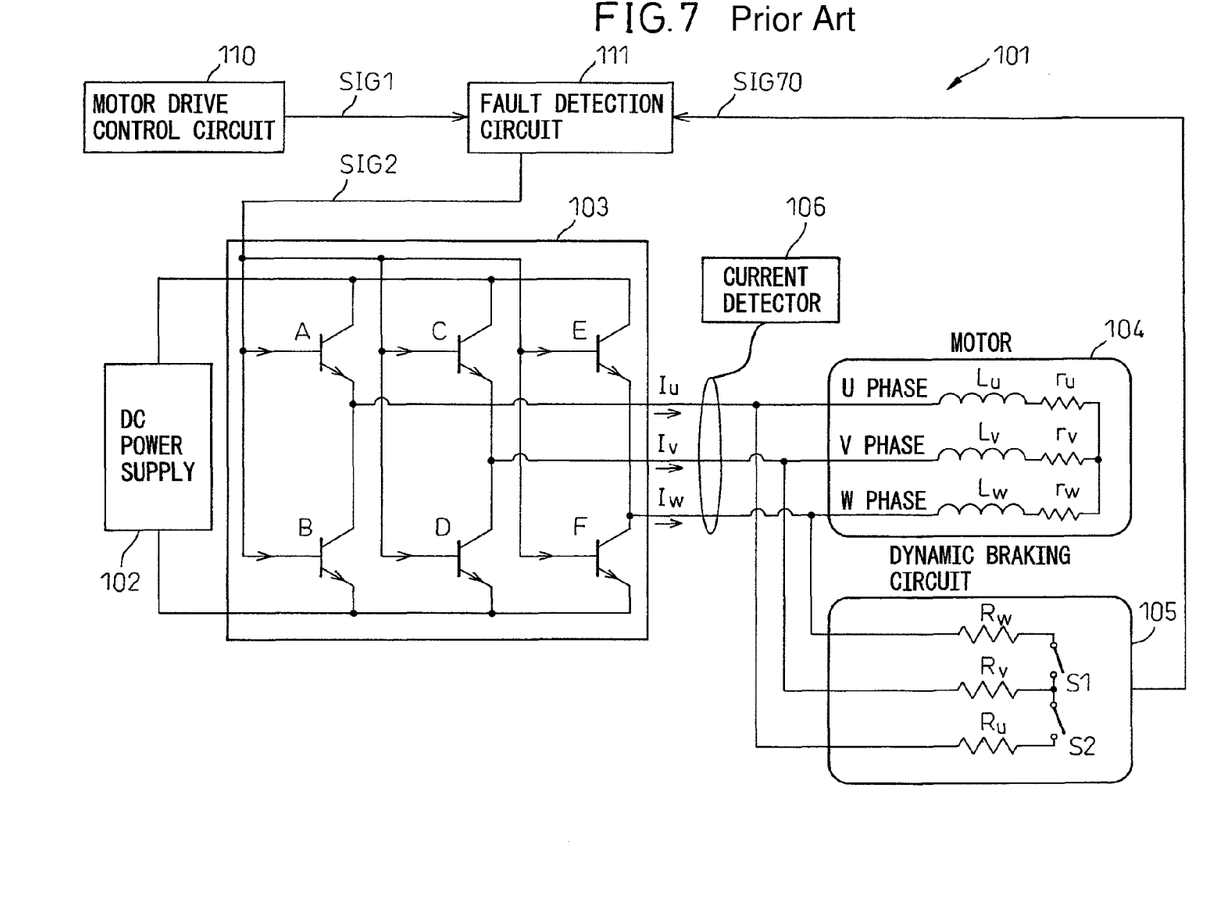
FIG. 7 is a block diagram showing the configuration of a motor drive apparatus according to the prior art.

FIG. 7 is a block diagram showing the configuration of a motor drive apparatus according to the prior art.

In the motor drive apparatus 101 shown in FIG. 7, a DC power supply 102 converts AC power, supplied from an AC power supply not shown, into DC power. The DC power from the DC power supply 102 is supplied to a synchronous motor 104 (hereinafter referred to as the motor) via a power transistor unit 103 comprising power transistors A to F. When the power to the motor 104 is cut off while the motor 104 is running, a dynamic braking circuit 105 actuates switches S1 and S2, i.e., relay contacts, so that the power is dissipated through resistors Ru, Rv, and Rw in the dynamic braking circuit 105.

A motor drive control circuit 110 outputs a dynamic braking circuit control signal SIG1, in response to which a fault detection circuit 111 generates a power transistor control signal SIG2 for controlling the driving/stopping of the motor 104, i.e., a power transistor ON/OFF signal, and supplies it to the power transistors A to F in the power transistor unit 103. A current detector 106 detects current flowing from the power transistor unit 103 to the motor 104.

The fault detection circuit 111 receives the dynamic braking circuit control signal SIG1 from the motor drive control circuit 110 and a contact state signal SIG70 from the dynamic braking circuit 105, i.e., an ON/OFF signal indicating the operation ON/OFF state of the motor 104 in accordance with the ON/OFF state of the switches S1 and S2, and detects from these signals a fault occurring in the dynamic braking circuit 105 (such as a contact welding defect or an electrically inoperable contact, breakage of a resistor, or disconnection of a connecting cable). To check the operation of the dynamic braking circuit 105 at the time of control of the motor 104, it is common to use the contact state signal SIG70 that indicates the contact state of the switches S1 and S2 as hardware provided in the dynamic braking circuit 105.

Methods that do not use such a contact state signal are also known; as one such method, there is disclosed, for example, in Patent Publication No. 1, a method that checks the operation/non-operation of the dynamic braking circuit by lowering the DC voltage when starting the motor operation.

[Patent Publication No. 1] Japanese Patent No. 3383965 (refer to [CLAIM 1] in Patent Claims, paragraphs [0003] to [0006] in Patent Specification, and FIGS. 1 and 2)

The method that requires the addition of a hardware contact signal involves the problem that the apparatus cost increases.

On the other hand, the method of Patent Publication No. 1 that does not use such a contact signal requires the addition of a control circuit in order to perform control to obtain a low supply voltage necessary for fault detection, and this also involves the problem that the apparatus cost increases.

SUMMARY OF THE INVENTION

The present invention has been devised to solve the problem that the cost increases due to the addition of two extra hardware pieces, i.e., the contact signal and the control circuit, and it is an object of the present invention to provide a motor drive apparatus equipped with a dynamic braking circuit fault detection capability to detect faults in a dynamic braking circuit without requiring the addition of such two extra hardware pieces.

It is another object of the invention to enable the operation of the dynamic braking to be checked in a short time while the motor is in a stopped condition.

A motor drive apparatus that accomplishes the above objects has a dynamic braking circuit for producing a deceleration torque utilizing a braking force caused by a synchronous motor acting as a generator when the synchronous motor is deenergized, and is equipped with a dynamic braking circuit fault detection capability, comprising: a DC power supply which is obtained by rectifying input AC power; voltage application means for applying a voltage to a winding of the synchronous motor and to the dynamic braking circuit for a predetermined length of time by switching a power transistor connected to the DC power supply; current detection means for detecting the value of a current flowing from the power transistor; and fault checking means for checking the dynamic braking circuit for the presence or absence of a fault, based on the current value detected by the current detection means and on a predefined threshold value.

In the motor drive apparatus, the predetermined length of time during which the voltage is applied from the DC power supply is chosen so that a transient current that flows through the motor winding after the power transistor is turned on does not exceed a current that flows through a dynamic braking resistor.

In the motor drive apparatus, the predetermined length of time during which the voltage is applied from the DC power supply is set longer than a current detection delay time that occurs when the current detection means detects the current.

In the motor drive apparatus equipped, the threshold value is changed according to the resistance value of the dynamic braking circuit or to the inductance of the synchronous motor.

In the motor drive apparatus, an overcurrent detection circuit incorporated in a motor drive control circuit is used as the current detection means, and the threshold value is set so as to serve as an overcurrent detection level when checking the dynamic braking circuit for a fault.

According to the invention, the operation of the dynamic braking can be checked in a short time while the motor is in a stopped condition.

BRIEF DESCRIPTION OF THE DRAWINGS

FIGS. 3A to 3C are time charts showing a first specific example of the pattern of a dynamic braking circuit control signal and the resulting current (when there is no current detection delay) in the motor drive apparatus shown in FIG. 1.

FIGS. 4A to 4C are time charts showing a second specific example of the pattern of the dynamic braking circuit control signal and the resulting current (when there is current detection delay) in the motor drive apparatus shown in FIG. 1.

DESCRIPTION OF THE PREFERRED EMBODIMENTS

The embodiments of the present invention will be described below with reference to the accompanying drawings.

Figure 1:
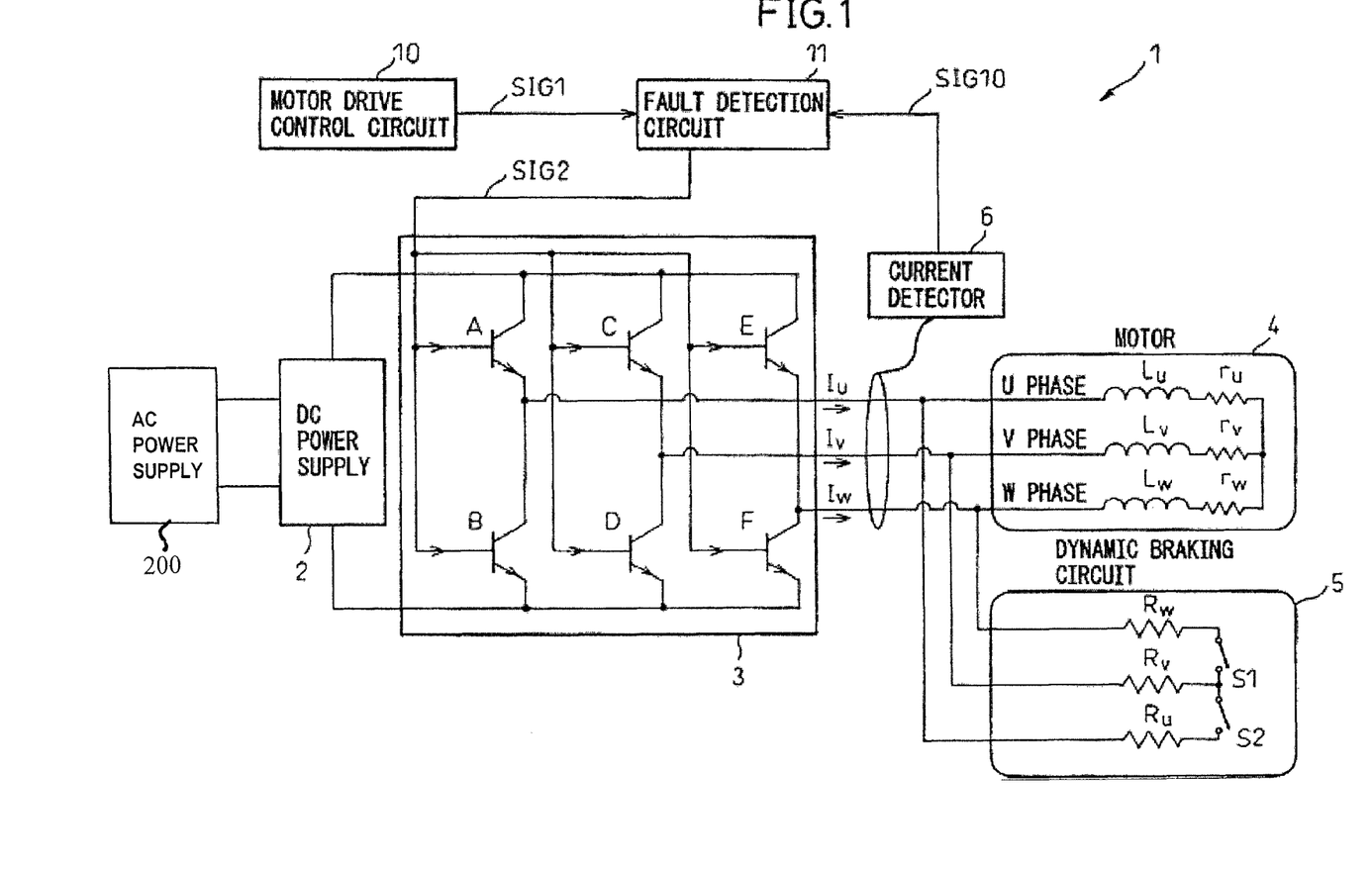
FIG. 1 is a block diagram schematically showing the configuration of a motor drive apparatus according to a first embodiment of the present invention.

FIG. 1 is a block diagram schematically showing the configuration of a motor drive apparatus according to a first embodiment of the present invention.

In the motor drive apparatus 1 generally shown in FIG. 1, a DC power supply 2 converts AC power, supplied from an AC power supply 200, into DC power. The DC power from the DC power supply 2 is supplied to a synchronous motor (hereinafter referred to as the motor) 4 via a power transistor unit 3 comprising power transistors A to F. When the power to the motor 4 is cut off while the motor 4 is running, a dynamic braking circuit 5 actuates switches S1 and S2, i.e., relay contacts, so that the power is dissipated through resistors Ru, Rv, and Rw in the dynamic braking circuit 5.

A motor drive control circuit 10 outputs a dynamic braking circuit control signal SIG1, in response to which a fault detection circuit 11 generates a power transistor control signal SIG2 for controlling the driving/stopping of the motor 4 and supplies it to the power transistors A to F in the power transistor unit 3. A current detector 6 detects current flowing from the power transistor unit 3 to the motor 4, converts the current value from analog to digital, and supplies the resulting current signal SIG10 to the fault detection circuit 11.

The fault detection circuit 11 receives the dynamic braking circuit control signal SIG1 from the motor drive control circuit 10 and the current signal SIG10 from the current detector 6, and detects from these signals a fault occurring in the dynamic braking circuit 5 (such as a contact welding defect or an electrically inoperable contact, breakage of a resistor, or disconnection of a connecting cable).

Figure 2:
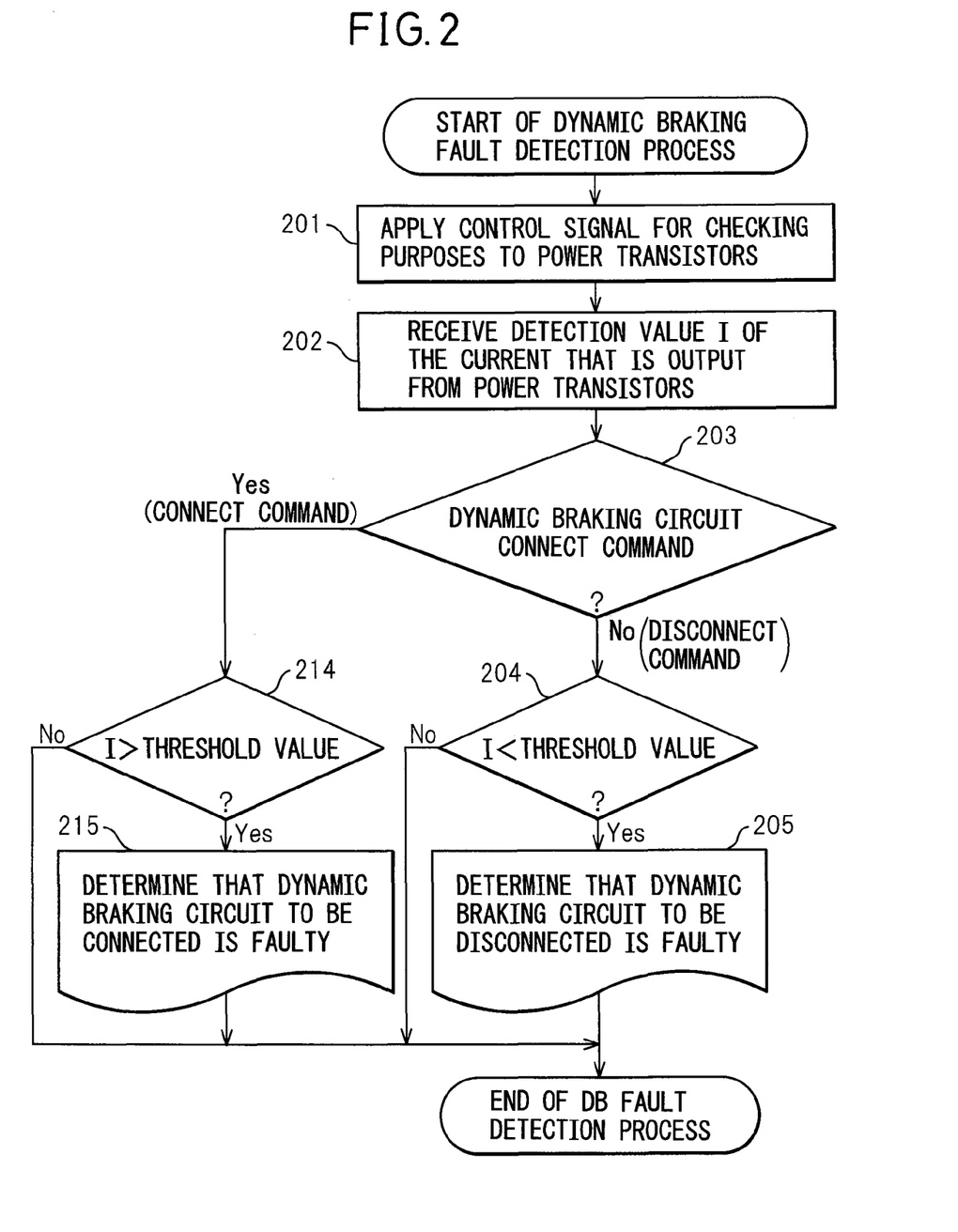
FIG. 2 is a flowchart illustrating a fault detection process for a dynamic braking circuit in the motor drive apparatus shown in FIG. 1.

FIG. 2 is a flowchart illustrating a fault detection process for the dynamic braking circuit in the motor drive apparatus 1 shown in FIG. 1. The process is executed by the fault detection circuit 11 comprising a conventional computer, that is, a CPU, an input/output interface, a RAM, a ROM, a disk, etc.

In step 201, the power transistor control signal SIG2 for checking purposes is applied to the power transistors A to F for a predetermined length of time Δt. The predetermined length of time Δt during which the voltage is applied from the DC power supply 2 to the dynamic braking circuit 5 is chosen so that the transient current that flows through the motor windings after the power transistors are turned on does not exceed the current that flows through the dynamic braking resistors.

In step 202, the current that is output from the power transistors A to F is detected by the current detector 6, and the analog-to-digital converted current signal SIG10 (current value I) is received.

In step 203, the dynamic braking circuit 5 checks whether the dynamic braking circuit control signal SIG1 output from the motor drive control circuit 10 is indicating a connect command or not; if the result of the check is YES, the process proceeds to step 214, but if the result of the check is NO, the process proceeds to step 204.

In step 204, the current value I received in step 202 is compared with a threshold value TH, and if I<TH, the process proceeds to step 205, but if I≧TH, the routine is terminated. The threshold value TH may be changed according to the resistance values Ru, Rv, and Rw of the dynamic braking circuit 5 or the inductances Lu, Lv, and Lw of the motor. Further, an overcurrent detection circuit (not shown) incorporated in the motor drive control circuit 10 may be used as the current detector 6, and the threshold value may be set so as to serve as an overcurrent detection level when checking the dynamic braking unit 5 for faults.

In step 205, it is determined that the dynamic braking circuit 5 is faulty, and a message "DYNAMIC BRAKING CIRCUIT TO BE DISCONNECTED IS FAULTY" is produced using a display or a printer not shown in FIG. 1.

In step 214, the current value I received in step 202 is compared with the threshold value TH, and if I>TH, the process proceeds to step 215, but if I≦TH, the routine is terminated.

In step 215, it is determined that the dynamic braking circuit 5 is faulty, and a message "DYNAMIC BRAKING CIRCUIT TO BE CONNECTED IS FAULTY" is produced using a display or a printer not shown in FIG. 1.

Figure 3:
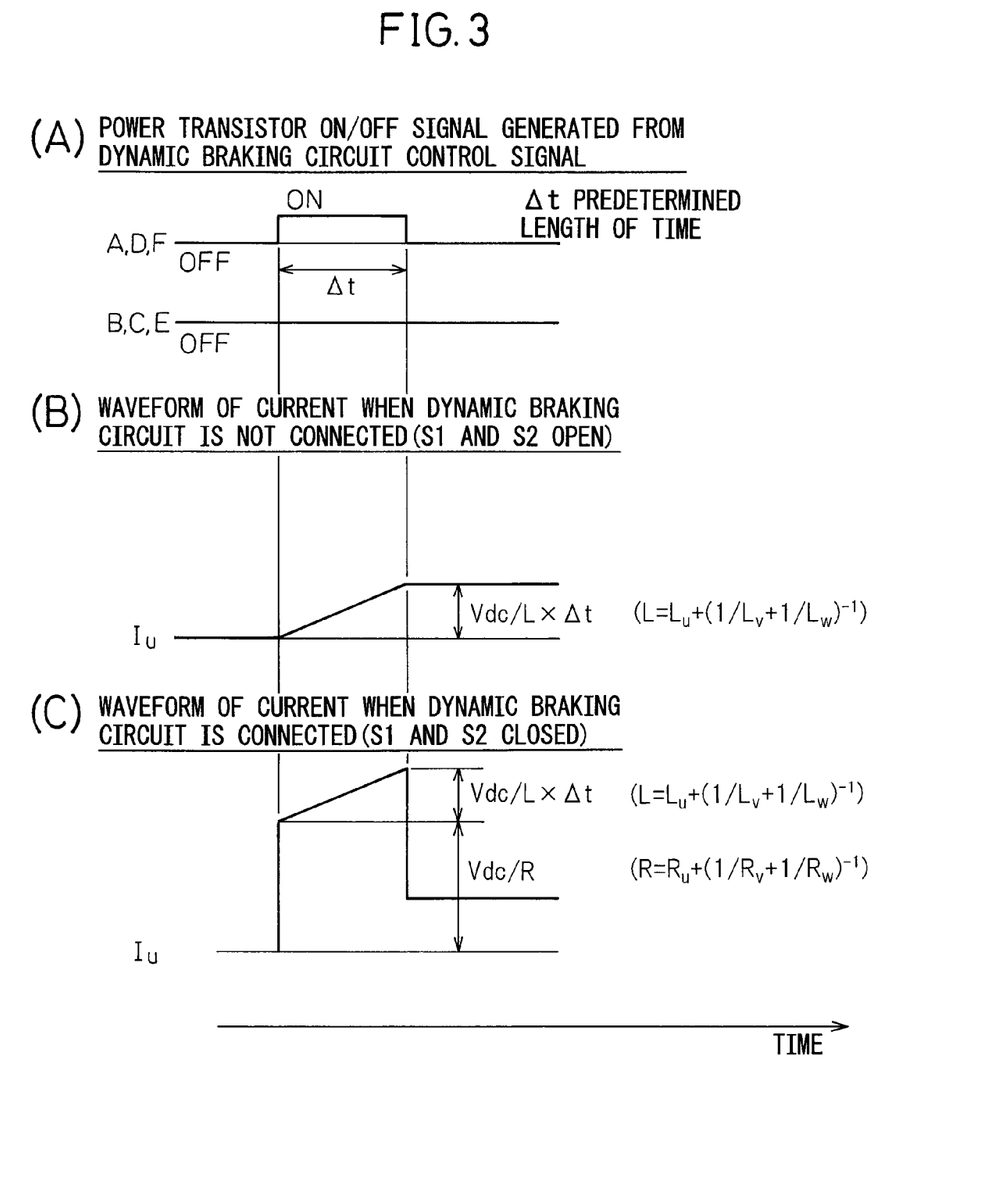
FIG. 3A shows a power transistor ON/OFF signal output from a fault detection circuit.
FIG. 3B shows the waveform of the current when the dynamic braking circuit is not connected.
FIG. 3C shows the waveform of the current when the dynamic braking circuit is connected.

FIGS. 3A to 3C are time charts showing a first specific example of the pattern of the dynamic braking circuit control signal and the resulting current (when there is no current detection delay) in the motor drive apparatus shown in FIG. 1: FIG. 3A shows the power transistor ON/OFF signal output from the fault detection circuit, FIG. 3B shows the waveform of the current when the dynamic braking circuit is not connected, and FIG. 3C shows the waveform of the current when the dynamic braking circuit is connected. In FIGS. 3A to 3C, the abscissa represents the time, the ordinate in FIG. 3A represents the ON/OFF state, and the ordinate in FIGS. 3B and 3C represents the waveform of the current.

Usually, when the power to the motor 4 is cut off while the motor 4 is running, the dynamic braking circuit 5 is connected to the motor power line, and the energy from the motor 4 is dissipated through the resistors Ru, Rv, and Rw in the dynamic braking circuit 5, thereby reducing the stopping distance of the motor.

On the other hand, when driving the motor 4, the dynamic braking circuit 5 is disconnected from the power transistor unit 3 which is a motor drive circuit, and only the motor 5 is connected to the motor driving power transistor unit 3.

If the contacts for connecting the dynamic braking circuit 5 to the motor power line remain closed due to welding defects, and the dynamic braking circuit 5 is not disconnected from the motor power line when driving the motor 4, the currents Iu, Iv, and Iw for driving the motor 4 flow into the dynamic braking circuit 5, resulting in an inability to perform desired current control or in overheating the resistors in the dynamic braking circuit 5 or generating an overcurrent alarm.

The motor drive apparatus 1 provided by the present invention is equipped with a capability to apply a dynamic braking checking control signal SIG2 before driving the motor 4 and thereby verify that the dynamic braking circuit 5 is disconnected or connected properly.

More specifically, the DC power supply 2 for driving the motor 4 is obtained by rectifying the input AC power, and the voltage from the DC power supply 2 is applied via the power transistors A to F to the motor windings Lu, Lv, and Lw for a suitable length of time for the respective phases U, V, and W of the motor 4, and the currents Iu, Iv, and Iw flowing from the power transistors A to F to the resistors ru, rv, and rw of the respective windings of the motor 4 are detected by the current detector 6 to check the dynamic braking circuit 5 for any fault.

When voltage Vdc is applied from the DC power supply 2 to the power transistors A to F and to the dynamic braking circuit 5 and the motor 4, the current I (Iu, Iv, Iw) that flows from the power transistors A to F after time t has elapsed from the application of the voltage is expressed by the following equation.

$$I = Vdc/r\{1 - \exp(-r/L*t)\} + Vdc/R \quad \text{(Equation 1)}$$

where
r: Motor winding resistance
L: Motor inductance
R: Dynamic braking circuit resistance As far as the transient period immediately after switching is concerned, it may be assumed that $r/L*t \ll 1$, and therefore Equation 1 can be approximated by Equation 2 shown below.

$$I \approx Vdc/L*t + Vdc/R \quad \text{(Equation 2)}$$

The first term Vdc/L*t represents the current I (Iu, Iv, Iw) that flows into the windings Lu, Lv, and Lw of the motor 4, and the second term Vdc/R represents the current I (Iu, Iv, Iw) that flows into the dynamic braking circuit 5. The first characteristic here is that the current I (Iu, Iv, Iw) that flows when the dynamic braking circuit 5 is disconnected is different by an amount equal to Vdc/R from that when the dynamic braking circuit 5 is connected.

Figure 4:
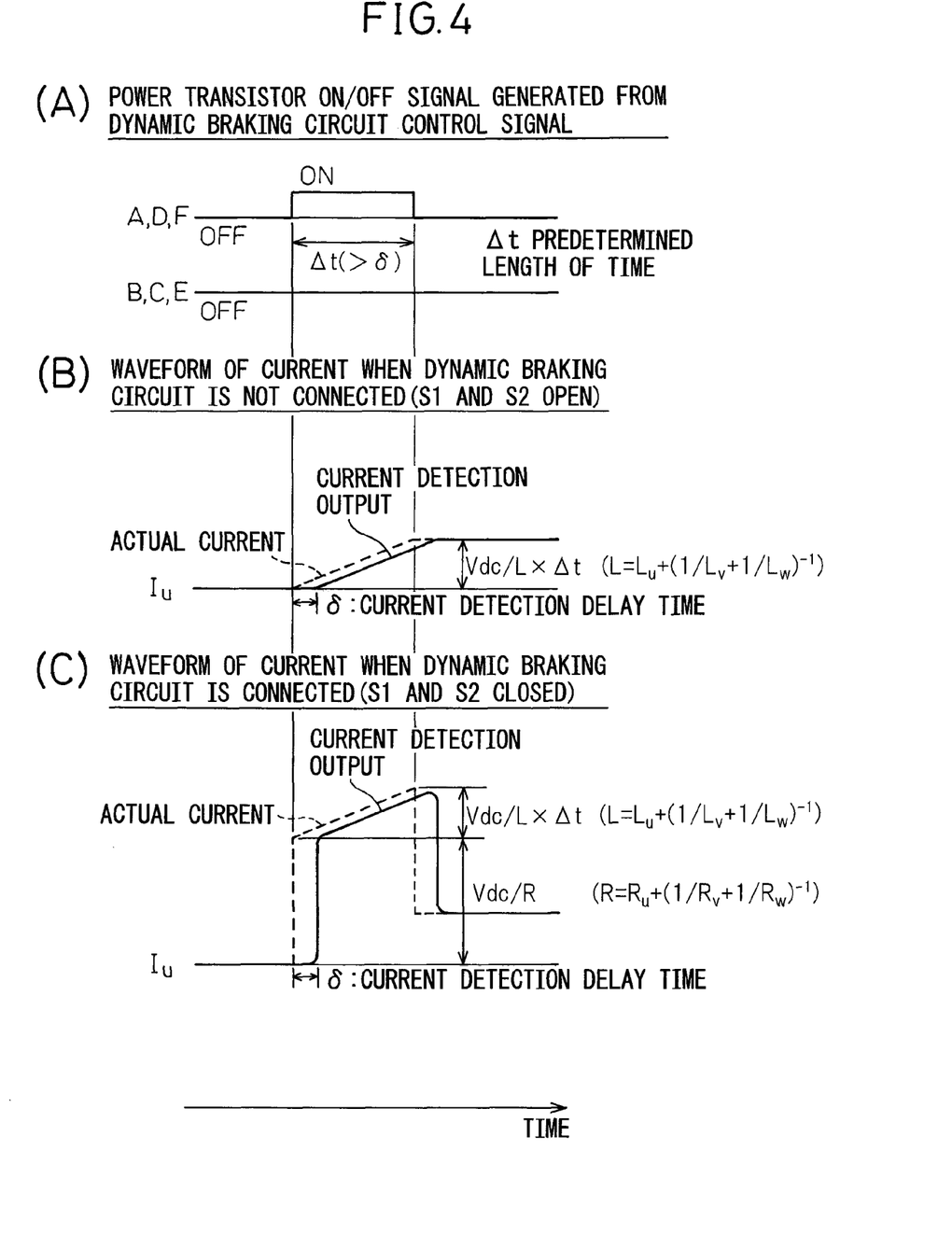
FIG. 4A shows the power transistor ON/OFF signal output from the fault detection circuit.
FIG. 4B shows the waveform of the current when the dynamic braking circuit is not connected.
FIG. 4C shows the waveform of the current when the dynamic braking circuit is connected.

FIGS. 4A to 4C are time charts showing a second specific example of the pattern of the dynamic braking circuit control signal and the resulting current (when there is current detection delay) in the motor drive apparatus shown in FIG. 1: FIG. 4A shows the power transistor ON/OFF signal output from the fault detection circuit, FIG. 4B shows the waveform of the current when the dynamic braking circuit is not connected, and FIG. 4C shows the waveform of the current when the dynamic braking circuit is connected. In parts FIGS. 4A to 4C, the abscissa represents the time, the ordinate in FIG. 4A represents the ON/OFF state, and the ordinate in FIGS. 4B and 4C represents the waveform of the current.

The current I (the first term) (Iu, Iv, Iw) that flows into the windings Lu, Lv, and Lw of the motor 4 has a large inductive component, and hence the second characteristic that it takes time to rise after the power transistors A to F are turned on.

The predetermined length of time $\Delta t$ during which the voltage is applied from the DC power supply 2 is set longer than the current detection delay time $\delta$ that occurs when the current detector 5 detects the current.

From the first and second characteristics, when the current I (Iu, Iv, Iw) flowing from the power transistors A to F is detected immediately after ($\Delta t$ seconds after) switching the power transistors A to F, if, despite the presence of a command for connecting the dynamic braking circuit 5 to the windings Lu, Lv, and Lw of the motor 4, the current I (Iu, Iv, Iw) flowing from the power transistors A to F is smaller than a threshold value which is set as a current value smaller than Vdc/R but larger than Vdc/L*$\Delta t$, it is determined that a fault has occurred such as an electrically inoperable contact in the switches S1 and S2 functioning as relay contacts for connecting the dynamic braking circuit 5, breakage of a resistor in the dynamic braking circuit 5, or disconnection of a connecting cable to the motor power line.

On the other hand, if, despite the presence of a command for disconnecting the dynamic braking circuit 5 from the windings Lu, Lv, and Lw of the motor 4, the current I (Iu, Iv, Iw) flowing from the power transistors A to F is larger than the threshold value, it is determined that a fault has occurred such that the contacts for connecting the dynamic braking circuit 5 remain closed due to welding defects.

An overcurrent detection circuit (not shown) originally provided in the motor drive control circuit 10 may be used to detect the current value.

Figure 5:
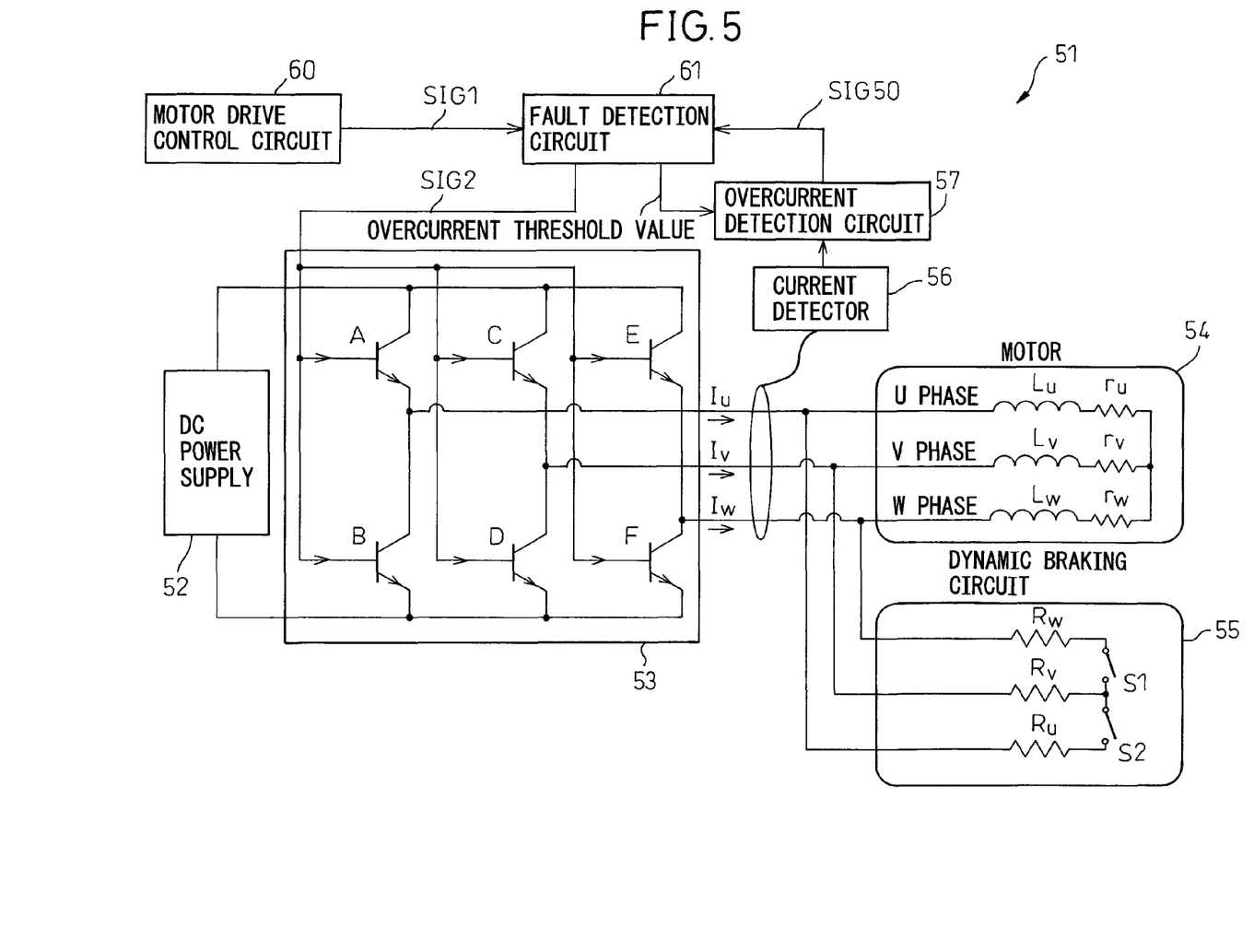
FIG. 5 is a block diagram schematically showing the configuration of a motor drive apparatus according to a second embodiment of the present invention.

When an overcurrent detection circuit 57 such as shown in FIG. 5 described below is used, it is also possible to use the threshold value by switching between the threshold value for checking the dynamic braking circuit 5 (the overcurrent detection level) and the normal (motor driving) overcurrent detection level.

FIG. 5 is a block diagram schematically showing the configuration of a motor drive apparatus according to a second embodiment of the present invention.

In the motor drive apparatus 15 generally shown in FIG. 5, the DC power output from a DC power supply 52 is supplied to a motor 54 via a power transistor unit 53 comprising power transistors A to F. When the power to the synchronous motor (hereinafter referred to as the motor) 54 is cut off while the motor 54 is running, a dynamic braking circuit 55 actuates switches S1 and S2, i.e., relay contacts, so that the power is dissipated through resistors Ru, Rv, and Rw in the dynamic braking circuit 55.

A motor drive control circuit 60 outputs a dynamic braking circuit control signal SIG1, in response to which a fault detection circuit 61 generates a power transistor control signal SIG2 for controlling the driving/stopping of the motor 4 and supplies it to the power transistors A to F in the power transistor unit 53. A current detector 56 detects current flowing from the power transistor unit 53 to the motor 54. An overcurrent detection circuit 57 compares the current value, detected and analog-to-digital converted by the current detector 56, with the overcurrent threshold value supplied to the overcurrent detection circuit 57, and supplies the resulting overcurrent state signal SIG50 to the fault detection circuit 61.

The fault detection circuit 61 receives the dynamic braking circuit control signal SIG1 from the motor drive control circuit 60 and the overcurrent state signal SIG50 from the overcurrent detection circuit 57, and detects from these signals a fault occurring in the dynamic braking circuit 55 (such as a contact welding defect or an electrically inoperable contact, breakage of a resistor, or disconnection of a connecting cable).

Figure 6:
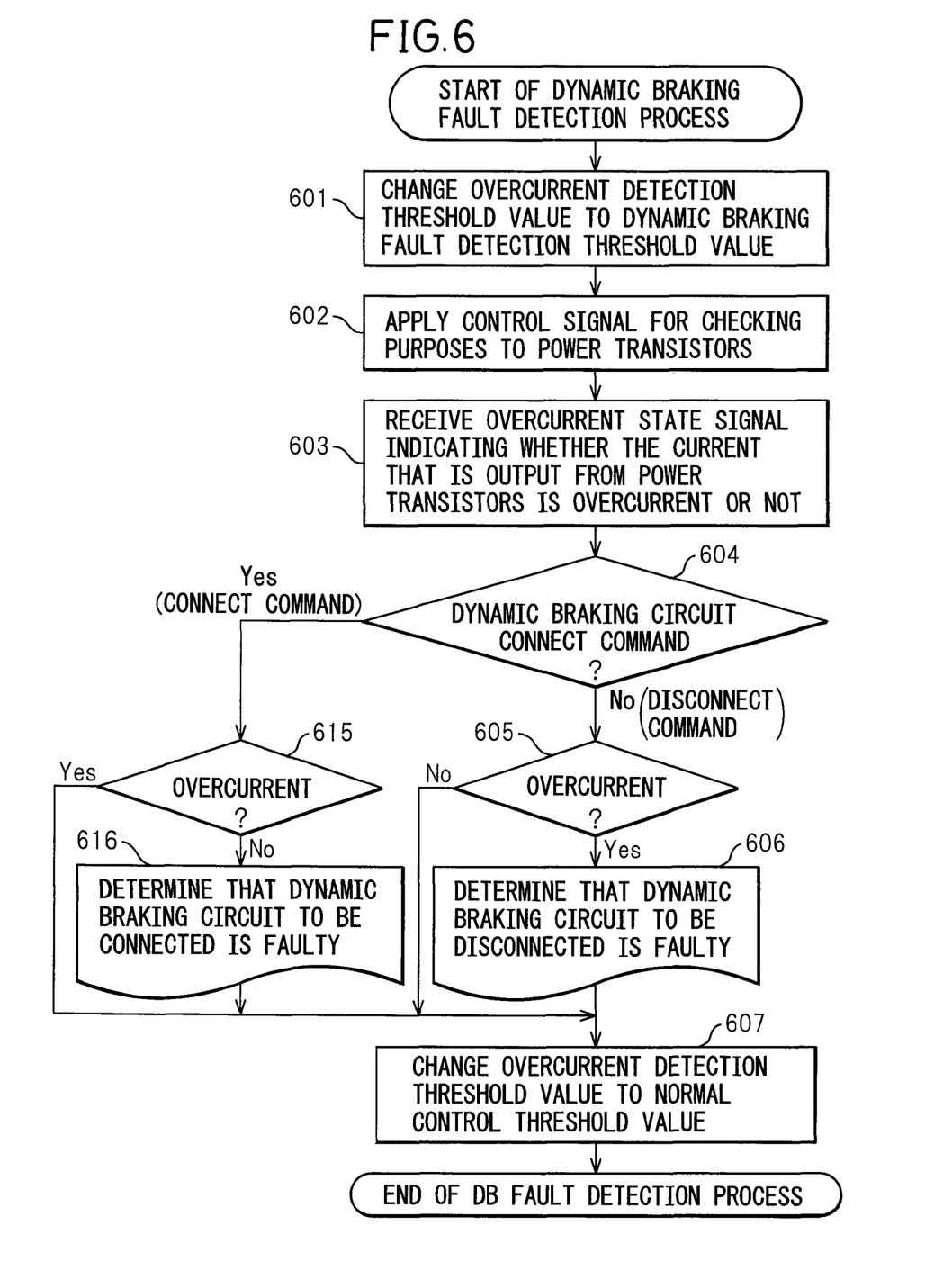
FIG. 6 is a flowchart illustrating a fault detection process for a dynamic braking circuit in the motor drive apparatus shown in FIG. 5.

FIG. 6 is a flowchart illustrating a fault detection process for the dynamic braking circuit in the motor drive apparatus shown in FIG. 5. The process is executed by the fault detection circuit 61 comprising a conventional computer, that is, a CPU, an input/output interface, a RAM, a ROM, a disk, etc.

In step 601, the overcurrent detection threshold value is changed from the normal control threshold value THNM to the dynamic braking fault detection threshold value THTM.

In step 602, the power transistor control signal SIG2 for checking purposes is applied to the power transistors A to F for a predetermined length of time Δt. The predetermined length of time Δt is set sufficiently longer than the current detection delay time δ(Δt>>δ).

In step 603, the current that is output from the power transistors A to F is detected and analog-to-digital converted by the current detector 56, and the overcurrent state signal SIG50 output from the overcurrent detection circuit 57 in response to the analog-to-digital converted current value I is received. The overcurrent detecting circuit 57 compares the current value I with the test mode threshold value THTM and, if I <THTM, it is determined that the current is not an overcurrent, and a level "0" is output; on the other hand, if I≧THTM, it is determined that the current is an overcurrent, and a level "1" is output.

In step 604, the dynamic braking circuit 55 checks whether the dynamic braking circuit control signal SIG1 output from the motor drive control circuit 60 is indicating a connect command; if the result of the check is YES, the process proceeds to step 615, but if the result of the check is NO, the process proceeds to step 605.

In step 605, if the overcurrent state signal SIG50 received in step 603 is at level "0," the process proceeds to step 607, but if it is at level "1," the process proceeds to step 606.

In step 606, it is determined that the dynamic braking circuit 55 is faulty, and a message "DYNAMIC BRAKING CIRCUIT TO BE DISCONNECTED IS FAULTY" is produced using a display or a printer not shown in FIG. 5.

In step 607, the overcurrent detection threshold value is changed from the dynamic braking fault detection threshold value THTM to the normal control threshold value THNM, and then the routine is terminated.

In step 615, if the overcurrent state signal SIG10 received in step 603 is at level "0," the process proceeds to step 616, but if it is at level "1," the process proceeds to step 607.

In step 616, it is determined that the dynamic braking circuit 55 is faulty, and a message "DYNAMIC BRAKING CIRCUIT TO BE CONNECTED IS FAULTY" is produced using a display or a printer not shown in FIG. 5.

What is claimed is:

1. A motor drive apparatus equipped with a dynamic braking circuit fault detection capability having a dynamic braking circuit for producing a deceleration torque utilizing a braking force caused by a synchronous motor acting as a generator when said synchronous motor is deenergized, comprising:

a DC power supply which is obtained by rectifying input AC power;

voltage application means for applying a voltage to a winding of said synchronous motor and to said dynamic braking circuit for a predetermined length of time by switching a power transistor connected to said DC power supply;

current detection means for detecting the value of a current flowing from said power transistor;

fault checking means for checking said dynamic braking circuit for the presence or absence of a fault, based on the current value detected by said current detection means and on a predefined threshold value; and wherein an overcurrent detection circuit incorporated in a motor drive control circuit is used as said current detection means, and said threshold value is changed from a normal first level threshold value to a second level threshold value for checking said dynamic braking circuit for a fault so as to serve as an overcurrent detection level when checking said dynamic braking circuit for a fault, and said predetermined length of time during which said voltage is applied from said DC power supply is chosen so that a transient current that flows through said motor winding after said power transistor is turned on does not exceed a current that flows through a dynamic braking resistor.

2. The motor drive apparatus equipped with a dynamic braking circuit fault detection capability as claimed in claim 1, wherein said predetermined length of time during which said voltage is applied from said DC power supply is set longer than a current detection delay time that occurs when said current detection means detects said current.

3. The motor drive apparatus equipped with a dynamic braking circuit fault detection capability as claimed in claim 1, wherein said threshold value is changed according to resistance value of said dynamic braking circuit or to inductance of said synchronous motor.

4. The motor drive apparatus equipped with a dynamic braking circuit fault detection capability as claimed in claim 2, wherein said threshold value is changed according to resistance value of said dynamic braking circuit or to inductance of said synchronous motor.

* * * * *